(12) United States Patent
McKee

(10) Patent No.: US 8,471,941 B2
(45) Date of Patent: *Jun. 25, 2013

(54) MISSING PIXEL ARRAY

(75) Inventor: Jeffrey A. McKee, Lake Oswego, OR (US)

(73) Assignee: Micron Technology, Inc., Boise, ID (US)

( * ) Notice: Subject to any disclaimer, the term of this patent is extended or adjusted under 35 U.S.C. 154(b) by 65 days.

This patent is subject to a terminal disclaimer.

(21) Appl. No.: 13/227,217

(22) Filed: Sep. 7, 2011

(65) Prior Publication Data

US 2011/0317046 A1 Dec. 29, 2011

Related U.S. Application Data

(63) Continuation of application No. 11/971,143, filed on Jan. 8, 2008, now Pat. No. 8,031,249.

(60) Provisional application No. 60/884,565, filed on Jan. 11, 2007.

(51) Int. Cl.
*H04N 3/14* (2006.01)

(52) U.S. Cl.
USPC .......................................... 348/308

(58) Field of Classification Search
USPC ............... 348/222.1, 241, 245, 294, 302, 308
See application file for complete search history.

(56) References Cited

U.S. PATENT DOCUMENTS

| | | | |
|---|---|---|---|
| 6,107,655 A | 8/2000 | Guidash | |
| 6,160,281 A | 12/2000 | Guidash | |
| 6,674,470 B1 | 1/2004 | Tanaka et al. | |
| 6,977,684 B1 | 12/2005 | Hashimoto et al. | |
| 7,009,646 B1 | 3/2006 | Fossum et al. | |
| 7,244,918 B2 | 7/2007 | McKee et al. | |
| 7,714,917 B2 | 5/2010 | McKee | |
| 2005/0012836 A1 | 1/2005 | Guidash | |
| 2005/0110885 A1 | 5/2005 | Altice et al. | |
| 2006/0158529 A1 | 7/2006 | Katagiri | |
| 2006/0256221 A1 | 11/2006 | McKee et al. | |
| 2007/0040922 A1 | 2/2007 | McKee et al. | |

FOREIGN PATENT DOCUMENTS

| | | |
|---|---|---|
| EP | 1 102 323 A1 | 5/2001 |
| JP | 11-331713 | 11/1999 |

OTHER PUBLICATIONS

International Search Report dated Jun. 26, 2008 in corresponding International Application No. PCT/US2008/050533.
International Preliminary Report on Patentability dated Jul. 23, 2009 in corresponding International Application No. PCT/US2008/050533.

*Primary Examiner* — Sinh Tran
*Assistant Examiner* — Mark Monk
(74) *Attorney, Agent, or Firm* — Knobbe, Martens, Olson & Bear, LLP

(57) ABSTRACT

An active pixel sensor (APS) comprises a regular repeating pattern of geometrically similar pixel regions, active pixels of which have photodiodes formed therein. A remainder of the geometrically similar regions has electrical components shared amongst neighboring photodiodes, such as for collecting and amplifying signals from the photodiodes. A 4-way sharing arrangement is shown, with four active pixel regions aligned in a column and the shared electrical components in a pixel region, the pixel region being shaped and sized similarly to the active pixel regions, in an adjacent column.

21 Claims, 4 Drawing Sheets

MISSING PIXEL ARRAY

CROSS-REFERENCE TO RELATED APPLICATIONS

This application is a continuation of U.S. patent application Ser. No. 11/971,143, filed Jan. 8, 2008, which is a non-provisional of U.S. Provisional Patent Application No. 60/884,565, filed Jan. 11, 2007, which are both incorporated herein by reference in their entireties.

BACKGROUND OF THE INVENTION

1. Field of the Invention

This invention relates to solid state image sensors, and more specifically to active pixel image sensors.

2. Description of the Related Art

An active pixel sensor (APS) is an image sensor including an integrated circuit having an array of pixels, wherein each pixel typically contains a photodetector controlled by three or more transistors, or active circuitry elements. These active circuitry elements typically perform a pixel reset function, transfer charge, perform a voltage conversion, or are used in amplification. APS devices have been operated in a manner where each line or row of the imager is selected and then read out using a column select signal (analogous to a word and bit line in memory devices respectively). Conventionally, these components are provided for each photodetector and are located within a single pixel boundary.

FIG. 1A illustrates one pixel of a prior art image sensor. The pixel comprises a photodetector 10, a transfer gate 15, a floating diffusion region 20 for capacitive storage, a reset transistor 25, a row select transistor 40, and a source-follower transistor 45.

FIG. 1B schematically illustrates one pixel 100 of a prior art four transistor (4T) image sensor. The active elements of a pixel perform the functions of (1) photon to charge conversion by a photodiode 102; (2) transfer of charge to a floating diffusion node 108 by the transfer transistor 104; (3) resetting the floating diffusion node 108 to a known state before the transfer of charge to it by a reset transistor 106; (4) selection of a pixel cell or row of pixel cells for readout by a row select transistor 112; and (5) output and amplification of signals representing a reset-level voltage and a signal-level voltage based on the photo converted charges by a source-follower transistor 110, which has its gate connected to the floating diffusion node 108. The pixel 100 of FIG. 1B is formed on a semiconductor substrate as part of an imager device pixel array. The conventional four transistor (4T) pixel requires an operating voltage Vcc, as well as transfer gate (TG), row select (ROW) and reset (RST) control signals for operation.

FIG. 1C illustrates a block diagram of a CMOS imager device ("image sensor") 120 having a pixel array 125, with each pixel cell being constructed as described above (see FIG. 1B), or as other known pixel cell circuits. The pixel array 125 comprises a plurality of pixels arranged in a number of columns and rows (not shown). The pixels of each row in the array 125 are all turned on by a row select line, and the pixels of each column are selectively output by respective column select lines. The row select lines are selectively activated in sequence by a row driver 130 in response to a row address decoder 135, and the column select lines are selectively activated in sequence for activation of each row by a column driver 140 in response to a column address decoder 145. Thus, a row and column address is provided for each pixel.

The CMOS imager is operated by a control circuit 150, which controls the address decoders 135 and 145 for selecting the appropriate row and column lines for pixel readout, and the row and column driver circuitry 130 and 140, which apply driving voltage to the drive transistors of the selected row and column lines. The pixel output signals typically include pixel reset signals $V_{rst}$, taken off of the floating diffusion nodes 108 when reset by reset transistors 106 and the pixel image signals $V_{sig}$, which are taken off the floating diffusion nodes 108 after photo-generated charges collected in the photodiode are transferred into the FD 108 by the transfer gate transistor 104. The $V_{rst}$ and $V_{sig}$ signals are read by a sample and hold circuit 155 and are subtracted by a differential amplifier 157, which produces a signal $V_{rst}$-$V_{sig}$ for each pixel, which represents the amount of photons or light impinging on the pixels. These difference signals are digitized by an analog to digital converter 165. The digitized pixel signals are then fed to an image processor 170 to form a digital image. The digitizing and image processing can be located on or off the imager chip. In some arrangements, the differential signals $V_{rst}$-$V_{sig}$ can be amplified as differential signals and directly digitized by a differential analog to digital converter.

A problem with prior art image sensors is that the inclusion of all these components within a single pixel results in a reduction in the fill factor of the pixel because it takes up area that could otherwise be used by the photodetector. This reduces the sensitivity, saturation signal and quantum efficiency of the sensor, which in turn adversely affects the performance parameters that are critical to obtaining good image quality. Additionally, inclusion of these active circuit elements within the pixel places a limitation on the minimum size of the pixel, which adversely affects the size and cost of the image sensor.

One approach to improving the fill factor and the sensitivity of an APS device is by reducing the amount of area allotted to components for each pixel while maintaining the desired features and functionality of the pixel architecture. Area reduction can be accomplished by sharing electrical components among multiple pixels. APSs in which electrical components are shared are said to have "shared architecture."

Several schemes for sharing solid state components among pixels in an APS are disclosed, for example, in U.S. patent Publication No. 2006/0256221 A1 of McKee, published Nov. 16, 2006; U.S. patent application Ser. No. 11/207,744 of McKee et al., filed Aug. 22, 2005; U.S. patent application Ser. No. 11/213,937 of McKee et al., filed Aug. 30, 2005; and U.S. patent application Ser. No. 11/213,936 of McKee, filed Aug. 30, 2005 (collectively, "the McKee applications"). These disclosures include schemes for "2-way" sharing of electrical components between two pixels, and "4-way" sharing of electrical components among 4 pixels. For example, one or more of a floating diffusion region, source-follower amplifier, row select transistor, and reset transistor can be shared among multiple pixels to assist in increasing the fill factor of the pixel architecture.

BRIEF DESCRIPTION OF THE DRAWINGS

The invention will be better understood from the Detailed Description of the Preferred Embodiments and from the appended drawings, which are meant to illustrate and not to limit the invention. It will be appreciated that the drawings and features therein are not drawn to scale, and wherein.

DETAILED DESCRIPTION OF THE PREFERRED EMBODIMENTS

Figure 1A:
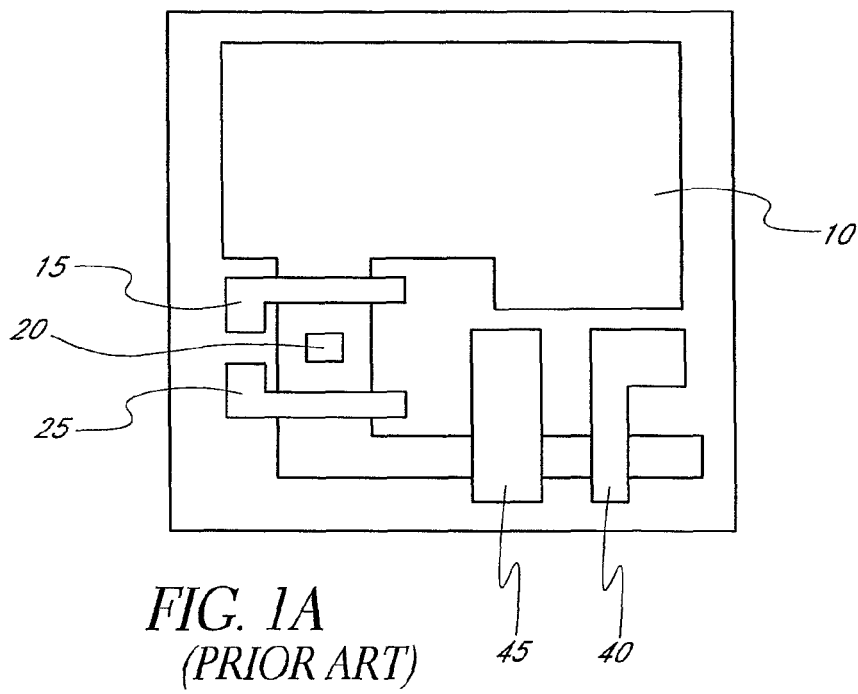
FIG. 1A is a schematic, top-plan view of a pixel of a prior art image sensor.

Active pixel sensors and other image sensors often have a trade-off between size of pixels in the sensor and the abilities of the sensor. More pixels may be more desirable, since it may enable the system to sense light with a higher resolution. However, more pixels can only be added by either increasing the size of the imaging array, and therefore the die size, or by reducing the size of the pixels themselves. In order to accommodate this trade-off, it is important that the pixels and electronic components associated with the pixels be efficiently distributed on the within the imaging array.

While the pixel sharing arrangements taught by the McKee applications and similar disclosures allow for the sharing of components and increasing the fill factors within active pixel sensors, interstitial arrangement of shared amplification and readout circuitry still occupies considerable space, including the extensive boundary regions surrounding the electrical components. The space occupied by the electrical components decreases the effective photodetector area. Accordingly, there remains a need within the art for an APS architecture that will lead to further increases in fill factor.

Preferred embodiments provide a device structure in which shared architecture is used to increase the effective photodetector area and simultaneously reduce the area reserved for electrical components associated with the photodetectors, thus leading to increases in fill factor. By localizing electrical components associated with a number of photodetectors, the effective photodetector area, and hence the quantum efficiency of an image sensor, can be increased.

In preferred embodiments, an image sensor (also referred to herein as "image sensing device") comprises a regular repeating pattern of geometrically similar regions, a plurality of the geometrically similar regions having photodiodes formed therein, wherein a remainder of the geometrically similar regions has electrical components shared amongst neighboring photodiodes. Each of the remainder of the regions shares amplification and readout circuitry preferably with at least two or more photodiodes, more preferably at least three or more photodiodes, and in the illustrated embodiment of FIGS. 2A and 2B (see below), a 4-way sharing arrangement is employed.

It will be appreciated that "geometrically similar regions" as used herein refers to regions that are substantially similar in shape and/or surface area. A pattern of geometrically similar shapes can include a pattern of circular areas, triangular areas, rectangular areas, pentagonal areas, hexagonal areas, heptagonal areas, etc. In the illustrated embodiment, the regions are substantially identical in both shape and surface area.

In preferred embodiments, geometrically similar regions are distributed over a semiconductor substrate. Photodiodes are formed within at least some of the geometrically similar regions, while electrical components associated with two or more photodetectors are provided in a remainder of the geometrically similar regions. Using shared architecture and forming the electrical components within regions that would have previously been occupied by photodiodes, preferred embodiments advantageously consolidate shared logic to reduce boundary regions surrounding the electrical components to thereby increase the fill factor and quantum efficiency of an image sensor. Furthermore, with the shared amplification circuitry occupying regions on the same pitch as the active photodiode pixels, the photodiodes will maximally occupy their allotted pixel regions and be more symmetrically arranged within the pixel regions.

It will be appreciated that "electrical components" as used herein designates electronic (or electrical) circuitry, to the exclusion of photodiodes, for collecting, relaying and/or amplifying signals from photodiodes. These include, without limitation, a transfer gate, row select gate, reset gate, floating diffusion node and source-follower gate. It will be appreciated that each of the gates represents a switch or transistor.

Reference will now be made to the figures, wherein like numeral refer to like parts throughout. It will be appreciated that the figures and features therein are not necessarily drawn to scale.

Figure 2A:
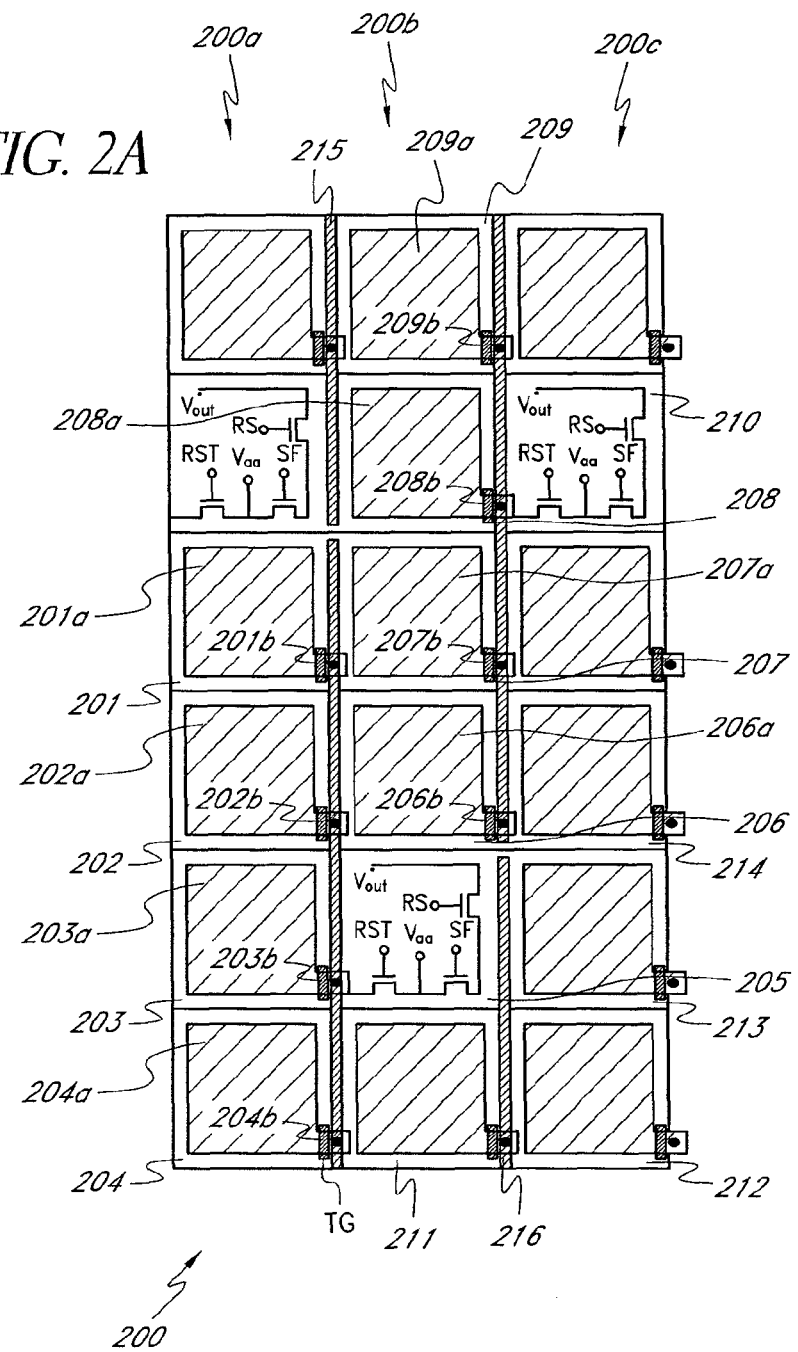
FIG. 2A is a schematic, top plan view of an image sensor, in accordance with preferred embodiments.

FIG. 2A illustrates a pixel array 200 of an image sensor. The pixel array 200 of the illustrated embodiment comprises a plurality of square pixel regions (also referred to herein as "pixels") distributed into three columns and six rows (18 pixels total). The pixel regions are preferably geometrically similar, i.e., they have substantially the same dimensions and/or shapes. While the pixel regions in the illustrated embodiment are square, it will be appreciated that the pixel regions can be of any shape (e.g., circular, triangular, rectangular, pentagonal, etc) and dimension. Additionally, while the pixel regions are arranged in orthogonal rows and columns, it will be appreciated that any distribution of pixel regions may be used. As an example, the pixel regions may be distributed in a hexagonal array, with each pixel region being shaped hexagonally.

With continued reference to FIG. 2A, a first column of pixels 200*a* comprises a first pixel 201, a second pixel 202, a third pixel 203 and a fourth pixel 204. The fourth pixel 204 is directly adjacent and disposed below the third pixel 203, the third pixel 203 is directly adjacent and disposed below the second pixel 202, and the second pixel 202 is directly adjacent and disposed below the first pixel 201. Each of the pixels 201-204 has a photodiode formed therein. Pixel 201 comprises photodiode 201*a*, pixel 202 comprises photodiode 202*a*, pixel 203 comprises photodiode 203*a* and pixel 204 comprises photodiode 204*a*. The photodiode in the pixels may be any solid state photodiode (or photodetector) known in the art. A photodiode associated with each pixel is preferably formed in a portion of an underlying substrate. The photodiodes 201*a*-204*a* are associated with transfer gates 201*b*-204*b*, which in the illustrated arrangement are formed in the same pixel regions as photodiodes (i.e., they are not shared). Pixels comprising photodiodes are herein also referred to as "active pixels."

Photodiodes 201*a*-204*a* are connected through interconnect 215 (or conductive line) to control elements formed in pixel 205. Pixel 205 is in a second column 200*b* adjacent the first column 200*a*. Pixel 205 is shaped substantially similar to active pixels 201-204 and it occupies substantially the same surface area and is on pitch with the grid of active pixels 201-204. Pixel 205 is herein also referred to as a "missing pixel" or "missing active pixel" because it lacks a photodiode. Electrical components in pixel 205 are used to collect, relay and/or amplify signals generated by photodiodes 201*a*-204*a*. Pixel 205 is preferably directly adjacent one of the active pixels 201-204 (active pixel 203, as illustrated). This advantageously leads to increase in the fill factor.

Figure 1B:
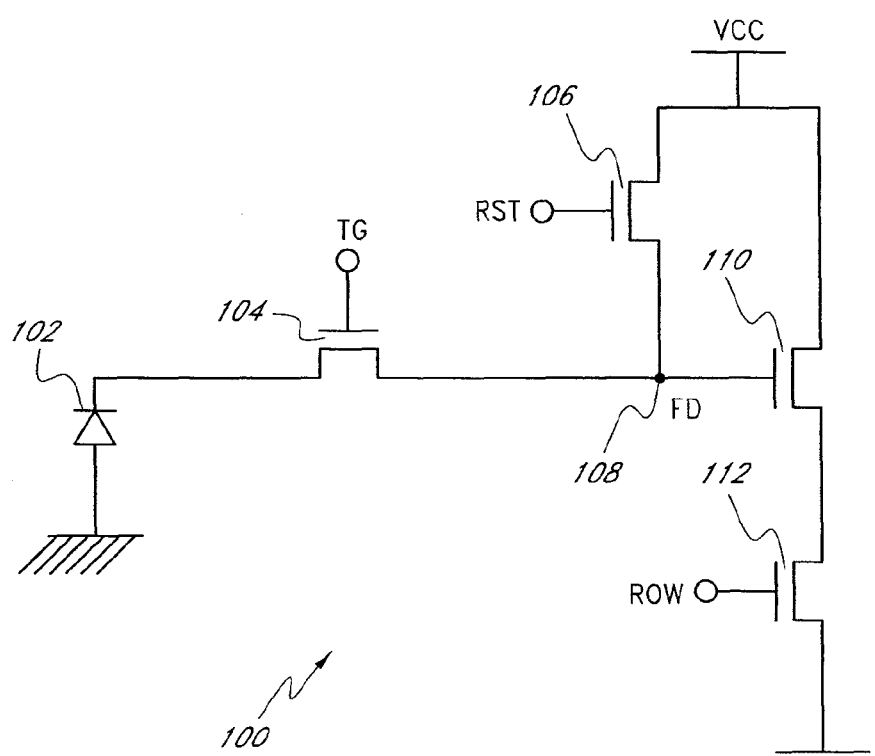
FIG. 1B is a schematic of a four transistor (4T) prior art image sensor.

The electrical components in pixel 205 may be any logic circuitry known in the art, such as the integrated electrical devices illustrated in FIG. 1B. The electrical components in pixel 205 comprise a reset gate (RST), source-follower gate (SF), row select gate (RS), a voltage output node (Vout) and an applied voltage node (Vaa). The electrical components in pixel 205 are configured to readout signals, in particular, to collect, relay and amplify signals generated by photodiodes 201a-204a. Thus, photodiodes 201a-204a are configured for 4-way sharing.

With continued reference to FIG. 2A, the second column 200b further includes a sixth pixel 206, a seventh pixel 207, an eight pixel 208 and a ninth pixel 209. Pixels 206-209 have formed therein photodiodes 206a-209a and transfer gates 206b-209b, which are connected through another interconnect 216 to electrical components formed in pixel 210 in a third column 200c adjacent the second column 200b. Pixel 210 is a missing pixel because it lacks a photodiode. The logic circuitry in pixel 210 is analogous to the logic circuitry in pixel 205 and is shared among photodiodes 206a-209a. Photodiodes 206a-209a are configured for 4-way sharing. Electrical components in pixel 210 are used to operate photodiodes 206a-209a. Pixel 210 is preferably directly adjacent one of the active pixels 206-209 (active pixel 208, as illustrated).

While in the illustrated embodiment a missing pixel (and control elements therein) are associated with (or shared among) four active pixels, it will be appreciated that each missing pixel may be shared generally between two or among more active pixels. As an example, missing pixel 205 may be shared among 2, 3, 5 or 6 row adjacent active pixels (i.e., active pixels in the same column adjacent to one another). The missing pixel 205 is preferably shared among at least three row adjacent active pixels, more preferably among at least four row adjacent active pixels to maximize the fill factor. Further, while four row adjacent active pixels are associated with one missing pixel and amplification circuitry therein, it will be appreciated that the active pixels need not be row adjacent. For example, the control elements in missing pixel 205 may be shared among pixels 204, 203, 213 and 214. In such a case, it will be appreciated that control elements in pixel 205 will be modified accordingly. However, the illustrated vertical alignment is preferred in order to minimize dead space due to the sharing of interconnects, such as interconnect 215.

Figure 2B:
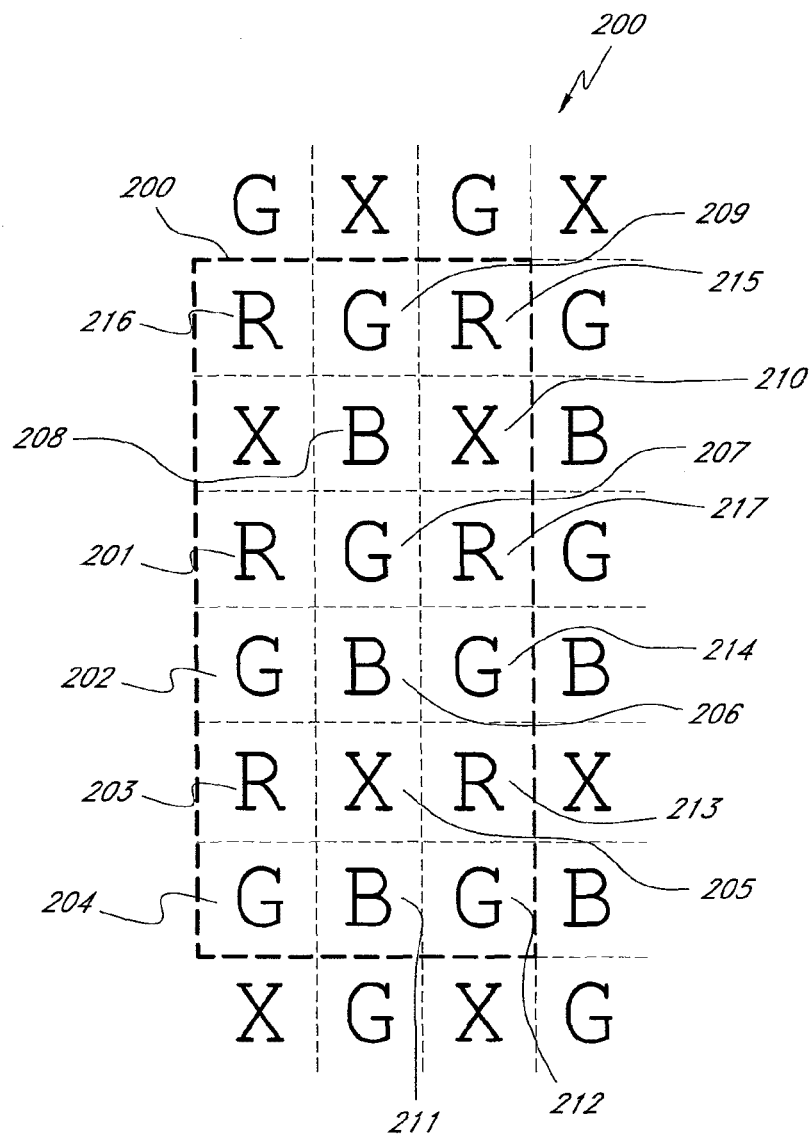
FIG. 2B shows the distribution of colors recorded by each of the pixels in FIG. 2A, in accordance with preferred embodiments.

With reference to FIGS. 2A and 2B, each of the photodiodes preferably has a filter that permits only particular wavelengths of light to pass through. Thus, with light incident on the array 200, each of the photodiodes 201a-204a and 206a-209a is configured to generate an electrical current in response to particular wavelengths of light. As an example, photodiode 201a may respond to red light and photodiode 202a may respond to blue light. Additionally, the pixels are arranged (or ordered) according to a particular color scheme. While there are a number of different ways the pixels can be arranged, in practice the most common is the Bayer pattern, which includes alternating red ("R") and green ("G") pixels for one column and alternating green ("G") and blue ("B") pixels for an adjacent column.

Interpolation

The pixels in the illustrated embodiment are arranged according to the Bayer pattern. FIG. 2B illustrates the color each pixel is configured to record. For example, the photodiode in pixel 201 will respond to (and record) red light ("R"), the photodiode in pixel 202 will respond to green light ("G") and the photodiode in pixel 208 will respond to blue light ("B"). Missing pixels in the illustrated embodiment are each designated by an "X" and will typically have a color filter over them corresponding to the repeating Bayer pattern even though these pixels are not configured to record any particular color.

While the pixels in the illustrated embodiment are arranged according to the Bayer pattern, it will be appreciated that the pixels can be arranged according to any color scheme (or pattern) known in the art, such as, for example, a CYGM (cyan, yellow, green, magenta) pattern. To prevent any image artifacts (during color processing), it is desirable to have the missing pixel "X" not fall under the same color filter (e.g., not always under red).

The columns in the illustrated embodiment comprise repeating patterns of RGRG in one column and GBGB in an adjacent column. As such, the ratio of red, green and blue arrays is 1:2:1. While the array 200 has been ordered according to a RGB Bayer distribution of colors, it will be appreciated that other distributions may be used.

Figure 1C:
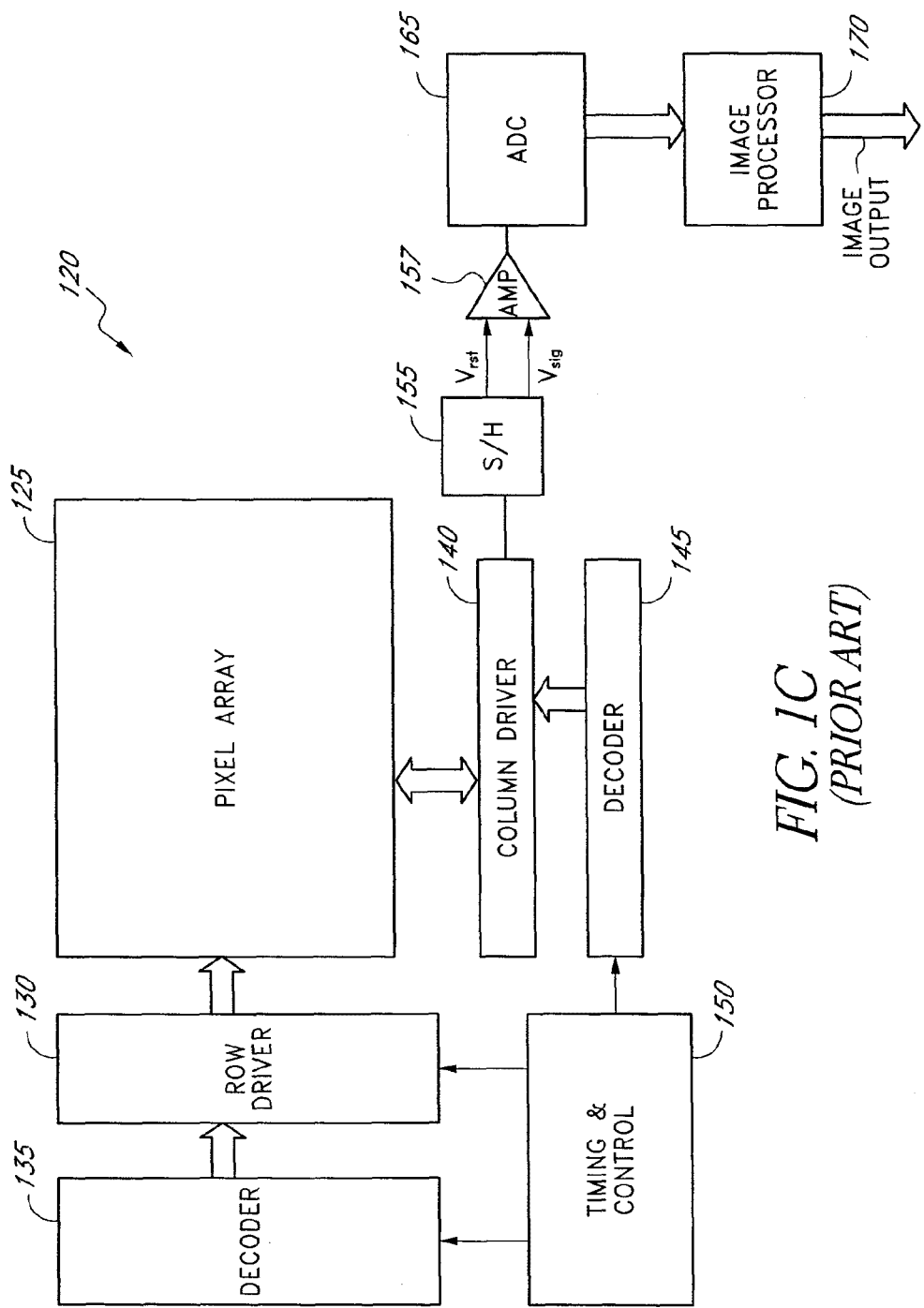
FIG. 1C is a block diagram of a conventional imager.

Each pixel is preferably associated with a full color range. However, since each pixel is configured (or provided with a filter) to sense wavelengths corresponding to one color (i.e., R, G, or B), two-thirds of the color data is missing from each pixel. For each pixel to have a full color range, the missing colors are preferably interpolated from neighboring pixels by a control system (or controller) programmed to control and read signals from the array 200. Such a controller may be similar to that discussed in the context of FIG. 1C, though with additional programming, as discussed below. As such, each pixel can have associated with it an $R_{int/act}G_{int/act}B_{int/act}$ value for a Bayer pattern, wherein "int" designates the magnitude of a signal or electric current for an interpolated color and "act" designates the magnitude of a color signal or electric current generated from light actually sensed by the photodiode in that pixel. For example, the photodiode of pixel 208 is configured to sense blue light—it is not configured to sense red and green lights. For pixel 208 to have a full color range $R_{int}G_{int}B_{act}$, $R_{int}$ and $G_{int}$ can be interpolated from sensing signals generated by the nearest neighbor red and green pixels. If a nearest neighbor pixel is missing (e.g., the nearest neighbor is a missing pixel "X" or has a defective photodiode), a next nearest neighbor pixel, next-next nearest neighbor pixel, etc, may be used. Such interpolation to achieve a full color range for each pixel can be conventional, apart from adjustments due to the missing pixels.

Interpolation may entail averaging signals from various pixels. As an example, for pixel 208, $R_{int}=(R_{201}+R_{215}+R_{216}+R_{217})/4$. However, the skilled artisan will appreciate that other interpolation schemes are available.

Signals representing intensity of colors for missing pixels 205 and 210 are preferably fully interpolated from nearest neighbor pixels (or next nearest neighbor pixels, next-next nearest neighbor pixels, etc), since no actual sensing is available from these pixel regions. As an example, a full range of colors for missing pixel 205 may be achieved by interpolating red values from pixels 203 and 213, green values from pixels 202, 204, 212 and 214, and blue values from pixels 206 and 211.

With further scaling of electrical components (e.g., amplification circuitry), it may be possible to fit small photodiodes in the missing pixels. However, it is preferred instead to simply reduce the pixel array pitch to maximize density and use the illustrated "missing pixel" arrangement with no photodiode in the region of the missing pixel. It is also possible, with further scaling, to expand the sharing arrangement from the illustrated 4-way sharing to, for example, 6-way or 8-way sharing.

Thus, in one embodiment, an image sensor having a pixel array is provided. The image sensor comprises a pattern of substantially identical pixel regions, including a first pixel region, a second pixel region and a third pixel region, is provided. The first pixel region preferably comprises electrical components shared amongst photodiodes in the second and third pixel regions.

In another embodiment, an image sensing device is provided. The image sensing device comprises a regular repeating pattern of geometrically similar regions, a plurality of the geometrically similar regions having photodiodes formed therein. A remainder of the geometrically similar regions has electrical components shared amongst neighboring photodiodes.

In yet another embodiment, an image sensor having a plurality of columns and rows, the plurality of columns and rows including pixel regions, is provided. The image sensor comprises a first column including a first plurality of pixel regions and a second column adjacent the first column, the second column including a second plurality of pixel regions. The second plurality of pixel regions includes a pixel region comprising electrical components (e.g., amplification circuitry) shared among a photodiode in each of n pixel regions of the first column, where n≧2.

In still another embodiment, a method for operating an image sensor is provided. The method comprises providing a regular repeating pattern of geometrically similar regions, a plurality of the geometrically similar regions having photodiodes formed therein, and collecting signals from the photodiodes using electrical components within a remainder of the geometrically similar regions.

In still another embodiment, a method for manufacturing an image sensing device is provided. The method comprises defining a pixel array comprising a pattern of substantially identical pixel regions. Electrical components are formed within at least one of the substantially identical pixel regions, wherein the electrical components are shared amongst photodiodes within two or more of the substantially identical pixel regions.

It will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. An image sensing device comprising:
    a grid of geometrically similar pixel regions comprising three active pixel regions each including a photodetector,
    and a missing pixel region including electrical components shared among at least the three active pixels regions,
    wherein the missing pixel region does not include a photodetector,
    wherein the three active pixel regions and the missing pixel region each have similar surface area,
    and wherein the missing pixel region is on pitch with the three active pixel regions in the grid.

2. The image sensing device of claim 1, wherein the grid comprises rows and columns, and wherein the three active pixel regions are included in one or more of columns adjacent to a column that includes the missing pixel region.

3. The image sensing device of claim 2, wherein the three active pixel regions are included in one column adjacent the column that includes the missing pixel region.

4. The image sensing device of claim 2, wherein the electrical components of the missing pixel region comprise transistors that include a row select gate, a source-follower gate, and a reset gate.

5. The image sensing device of claim 1, wherein the missing pixel region is directly adjacent to at least one of the three active pixel regions.

6. The image sensing device of claim 1, further comprising a controller programmed to interpolate a color of the missing pixel region based on colors associated with neighboring active pixel regions.

7. The image sensing device of claim 6, wherein the neighboring active pixel regions include at least one of the three active pixel regions.

8. The image sensing device of claim 1, further comprising a fourth active pixel region, wherein the electrical components are shared amongst the three active pixel regions and the fourth active pixel region.

9. An image sensor comprising;
    an array of geometrically similar regions each having substantially identical shape and substantially identical surface area, the array of geometrically similar regions consisting of active regions and remainder regions, wherein each active region includes a photodetector, wherein each remainder region includes electrical components shared among photodetectors in at least two of the active regions, and wherein each remainder region does not include a photodetector.

10. The image sensor of claim 9, wherein the array comprises a plurality of rows of the geometrically similar regions and a plurality of columns of the geometrically similar regions.

11. The image sensor of claim 10, wherein a first column of the plurality of columns includes at least two of the active regions, and wherein a second column of the plurality of columns includes at least one of the remainder regions that is configured to share electrical components among photodetectors in the at least two of the active regions.

12. The image sensor of claim 10, wherein the electrical components in at least one of the remainder regions comprise transistors including a row select gate, a source-follower gate, and a reset gate.

13. The image sensor of claim 9, wherein each of the remainder regions includes electrical components shared among photodetectors in at least four of the active regions.

14. The image sensor of claim 9, further comprising a controller programmed to interpolate signal values associated with the remainder regions based on signal values associated with respective neighboring regions of the active regions.

15. A method of operating an image sensor, the method comprising:
    providing a regular repeating pattern of geometrically similar regions that are similar in surface area to one another, wherein three or more of the geometrically similar regions are each configured with a filter to permit only particular wavelengths through; and
    collecting electrical signals generated in response to the particular wavelengths of light from the three or more geometrically similar regions via electrical components within an other region of the geometrically similar regions, wherein the other region does not include a photodetector.

16. The method of claim 15, further comprising interpolating a color associated with the other region based on colors associated with neighboring regions of the geometrically similar regions.

17. The method of claim 15, wherein said collecting includes collecting electrical signals from at least four of the geometrically similar regions via the electrical components in the other region.

18. The method of claim 15, wherein the regular repeating pattern is a grid, and wherein the other region is on pitch with the three or more geometrically similar regions.

19. An image sensor including a pixel array, the pixel array comprising:

a regular repeating pattern of pixel regions that are similar in shape and surface area to one another, the pixel regions comprising active pixel regions and remainder pixel regions, wherein the active pixel regions each includes a photodetector, wherein the remainder pixel regions each includes electrical components and does not include a photodetector, and wherein the pixel regions include at least three times as many active pixel regions as remainder pixel regions.

20. The image sensor of claim 19, further comprising a controller programmed to interpolate color values for the remainder pixel regions based on color values associated with neighboring active pixel regions.

21. The image sensor of claim 19, wherein the electronic components in each of the remainder pixel regions are shared among at least three active pixel regions.

\* \* \* \* \*